US006668667B2

(12) United States Patent
Seliger

(10) Patent No.: US 6,668,667 B2
(45) Date of Patent: Dec. 30, 2003

(54) ARRANGEMENT FOR SUBJECTING A BONDING WIRE TO A MECHANICAL LOAD

(75) Inventor: Norbert Seliger, Munich (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/240,246

(22) PCT Filed: Mar. 13, 2001

(86) PCT No.: PCT/DE01/00939

§ 371 (c)(1),
(2), (4) Date: Sep. 30, 2002

(87) PCT Pub. No.: WO01/74524

PCT Pub. Date: Oct. 11, 2001

(65) Prior Publication Data

US 2003/0047006 A1 Mar. 13, 2003

(30) Foreign Application Priority Data

Mar. 30, 2000 (GB) .......................................... 100 15 961

(51) Int. Cl.[7] ............................................... G01L 5/04
(52) U.S. Cl. .............................. 73/862.391; 73/862.381; 73/862.07
(58) Field of Search ..................... 73/862.391, 862.381, 73/862.07

(56) References Cited

U.S. PATENT DOCUMENTS

| 3,319,984 A | 5/1967 | Jones et al. ............. 287/189.36 |
| 5,533,398 A | 7/1996 | Sakurai ........................ 73/573 |

FOREIGN PATENT DOCUMENTS

JP            6-34505        2/1994

OTHER PUBLICATIONS

"Ultrasonics replace alternative methods," Interconnection Technology, vol. 10, No. 2, Feb. 1994, pp. 18–20.
Tsujino et al., "Welding characteristics of ultrasonic wire bonding using the same or a different frequency complex vibration welding tips," Japanese Journal of Applied Physics, vol. 28, Mar. 1989, pp. 137–139.
Auerbach et al., "Power–Cycling–Stability of IGBT–Modules," IEEE Industry Applications Society, New Orleans, Oct. 5–9, 1997, pp. 1248–1252.
Ravi et al., "Reliability Improvement of Wire Bonds Subjected to Fatigue Stresses," 10th annual preceedings, Reliability Physics 1972, Las Vegas, Nevada, Apr. 5–7, 1972, pp. 143–148.
Tomimuro et al., "Novel Reliability Test Method for Ribbon Interconnections Between MIC Substrates," IEEE, Seattle, Washington, May 5–7, 1986, pp. 324–330.

*Primary Examiner*—Edward Lefkowitz
*Assistant Examiner*—Alandra Ellington
(74) *Attorney, Agent, or Firm*—Young & Thompson

(57) ABSTRACT

An arrangement in which a first contact surface (2) for bonding one end (51) of the bonding wire (5) and a piezoelectric actuator (3) are fixed on a support body (1) and a second contact surface (4) for bonding another end (52) of the bonding wire (5) is fixed to the actuator by an unsupported support body (34). The second contact surface moves back and forth in relation to the support body by means of an actuator, at a frequency of between 0.1 Hz and a few KHz and in one or more directions (31, 31', 31"). The arrangement is suitable for use in testing the endurance of bonding wire connections.

8 Claims, 2 Drawing Sheets

ARRANGEMENT FOR SUBJECTING A BONDING WIRE TO A MECHANICAL LOAD

CROSS REFERENCE TO RELATED APPLICATION

This is the 35 U.S.C. 371 national stage of international application PCT/DE01/00939 filed on Mar. 13, 2001, which designated the United States of America.

FIELD OF THE INVENTION

The invention relates to an arrangement for mechanical loading of a bonding wire.

BACKGROUND OF THE INVENTION

Bonding wires of thick aluminum wire are used for purposes of electrical contact-making of the power components of power modules for gate and emitter terminals or for wiring within the module. The bonding technique is ultrasonic bonding, the wires which are circular in cross section having a diameter of typically 200 to 300 microns and arcs with 10 to 20 mm width and up to 5 mm height being implemented. In order to be able to transmit high currents via a contact, several wires are made parallel.

In special mounting techniques (integrated converter) bonding wires are also used as connecting elements between power modules and circuit boards which contain control electronics. When using this converter technique in traction drives or in drives for machine tools under shock and vibration stress high mechanical accelerations occur with resulting forces which can cause a considerable shift of the bond base points. This causes deformation of the wire and formation of considerable stresses in the wire which when the elasticity limit is exceeded lead to plastic deformation and subsequently to material fatigue. With a sufficiently large number of these mechanical loading cycles, which typically lie in the range of 1 to 10 million cycles, ultimately operating failure occurs in the form of material fracture. This fracture which is known as a "heel crack" occurs preferably at the wire site damaged previously generally by bonding, specifically at the kink point at the bond base which defines one end of the wire.

For a long time there were no effective indicators which could predict premature fatigue of the bond connection and thus probable operating failure. To safeguard the reliability of bond connections in integrated mounting technique therefore very time-consuming and thus also expensive loading tests, for example shock and vibration tests, were used. Due to time consumption these tests can only be used to a limited extent for studies on objects with a long service life.

Wire fatigue under vibration loading was studied in the past within the framework of loading tests in so-called vibration machines with adjustable vibration frequency and amplitude. These machines however can be used conventionally only for certain frequency ranges, limited to certain sample sizes, and are expensive.

In addition to mechanical loading of the wire, during operation moreover strong thermal loading of the wire occurs. The wire is on the one hand heated via electrical losses in the wire, on the other hand the chip surface acts as a heat source (power cycle load case). Associated with this the wire undergoes a change of length due to thermal expansion; this leads to arching of the wire. This deformation causes similar stress conditions in the wires, such as a displacement of the base points. Maximum bending stress occurs again at the kink point at the bond base. Addition deformation is superimposed on this loading and results from the thermal mismatch between the material, for example aluminum, of the bonding wire, and the material, for example silicon, of the chip surface, or the material, for example copper, of another contact surface, and causes mechanical stresses at the contact site of the bond base. The latter mechanism after a relatively large number of temperature cycles leads to formation of cracks at the contact site of the wire with the contact surface and ultimately to lifting of the wire away from the contact surface. The danger of wire lifting can be reduced by coating the bond base with a protective layer. In the latter case the deformation of the wire during thermal expansion contributes mainly to fatigue and ultimately leads to "heel crack".

In order to simulate the wire deformation which results during thermal expansion, K. V. Ravi. E. M. Philofsky in "Reliability improvement of wire bonds subjected to the fatigue stresses", 10th Proc. Reliab. Physics, Las Vegas, p. 143–148, 1972, suggested a test set-up in which the wire arc is periodically raised in the middle of the arc using a needle and in this way the arc height is increased. In this process the wire stress can lead to premature damage of the wire by the needle, pulling the wire can cause raising, and wire deformation differs considerably from the actual deformation upon thermal expansion.

H. Tomimuro, H. Jyumonji: "Novel Reliability Test Method for Ribbon Interconnections between MIC Substrates", Proc. 36th Electronic Components Conference, Seattle, p. 324–330, 1986 discloses an electromechanical tester for thermomechanical fatigue of bonded gold bands. In this test the bonded ends of the gold bands are shifted up to 100 microns to or from one another via a piezoelectric actuator. Thus the thermomechanical loading of the gold band which forms in MICs (=Microwave Integrated Circuits) is simulated by the different coefficients of thermal expansion of the mounting materials during a temperature change.

Specifically this known tester is an arrangement for producing a mechanical load on a gold band which has
 a carrier body,
 a first contact surface which is fixed relative to the carrier body for attachment by bonding one end of the gold band,
 a piezoelectric actuator which is mounted on a carrier body and which expands and contracts relative to the carrier body and in the direction to the first contact surface with a frequency of less than 1/60 Hz, and
 a second contact surface attached to the actuator for attachment by bonding the other end of the gold band which moves back and forth upon expansion and contraction of the actuator relative to the carrier body and in the direction to the first contact surface with a frequency of less than 1/60 Hz of this expansion and contraction.

The gold band used in this known tester has a thickness of 20 microns and a width of 350 microns and thus a cross sectional shape which deviates sharply from the circular cross section of a bonding wire.

The ageing of a bonding wire by alternating temperature loading was studied in the past by so-called power cycles in which the components are periodically turned on and off. Based on the high thermal time constants, periods of 1–5 seconds are conventional so that service life tests can last a few weeks (see for example F. Auerbach, A. Lenninger: "Power-Cycling-Stability of IGBT modules", IEEE Industry Applications Society, New Orleans, p. 1248–1252, 1997).

The degree of fatigue of the bond connection is checked by various tests: the shear tensile strength in a pull test (destructive, non-destructive), the shear strength in a shearing test and the kinking behavior in an air jet test. Detailed information about crack formation and possible acceleration factors for ageing can be obtained via REM (scanning emission microscopy), ultrasonic tests and chemical analyses (for example, Auger spectroscopy).

It has already been suggested that wire fatigue during a service life test be described via reliability indicators. The electrical resistance, the nonlinearity of the electrical resistance and the resistance noise are examples of these indicators.

The object of the invention is to make available an arrangement for mechanical loading of a bonding wire which makes it possible to simulate the mechanical loading case of displacement of the base points of the bond connection under vibration or shock stress.

This object is achieved by the features of claim 1.

According to this approach an arrangement for mechanical loading of a bonding wire is made available which has:
 a carrier body,
 a first contact surface which is fixed relative to the carrier body for attachment by bonding one end of the bonding wire,
 a piezoelectric actuator which is mounted on the carrier body and which can expand and contract relative to the carrier body and in the direction to the first contact surface with a frequency of at least 0.1 Hz,
 a second contact surface attached to the actuator for attachment by bonding the other end of the bonding wire which moves back and forth during expansion and contraction of the actuator relative to the carrier body and in the direction to the first contact surface with the frequency of this expansion and contraction.

With the arrangement as claimed in the invention, advantageously in a very early stage of development accelerated service life tests for the bond connection can be carried out and thus critical parameters for reliability such as for example the wire material, arc geometry, wire guidance during bonding can be studied and evaluated early.

SUMMARY OF THE INVENTION

The arrangement as claimed in the invention advantageously allows the quality of the aforementioned reliability indicators which comprise for example the electrical resistance, the nonlinearity of the electrical resistance and the resistance noise for the loading case of mechanical deformation of the wire since measurement of the electrical resistance of the bond connection in this structure is possible.

Other advantages of the arrangement as claimed in the invention are:
 It allows exact simulation of the displacements of the bond base points which occur during vibration and shock loading.
 As a result of the high stress frequency, service life tests on mechanical loading and fatigue can be clearly accelerated.
 The fatigue that accompanies deformation of the wire during thermal expansion can be simulated and due to the loading frequency which is higher compared to the performance cycle, accelerated stress tests can be carried out for this loading case.

The invention advantageously makes available an arrangement for producing a mechanical load on one bonding strip which has:

a carrier body,
 a first contact surface which is fixed relative to the carrier body for attachment by bonding one end of the bonding strip,
 a piezoelectric actuator means which is mounted on the carrier body and which can expand and contract independently in at least two different directions relative to the carrier body, and
 a second contact surface attached to the actuator means for attachment by bonding the other end of the bonding strip which moves back and forth in that direction in which the actuator means expands and contracts relative to the carrier body.

The concept of bonding strip here means a strip-shaped material of any cross sectional shape and comprises both bonding wires and also bonding bands such as for example the aforementioned known gold band.

By means of this arrangement the ends or bond base points of one bonding strip which are attached to the first and second contact surface can be advantageously deflected in a controlled manner in at least two, preferably and advantageously in all three spatial directions and thus complex deflection processes can be simulated. Thus, for example, a change of the base point height which causes tilting of the arc of the bonding strip can be simulated. This loading case arises in the temperature cycle due to the different thermal coefficients of expansion of the mounting materials.

In one preferred and advantageous embodiment of this arrangement the actuator means has a sequence of two or more interconnected actuators, and
 each actuator can expand and contract in each of one direction assigned only to it,
 the first actuator of the sequence is mounted on the carrier body and expands and contracts in the direction assigned to it relative to the carrier body,
 each actuator connected to the next actuator, when it expands and contracts in the direction assigned to it, moving this next actuator back and forth in this direction relative to the carrier body, and
 the second contact surface being mounted on the last actuator of the sequence, and moving back and forth in this direction relative to the carrier body when the last actuator expands and contracts in the direction assigned to it.

Preferably and advantageously in this arrangement one direction points toward the fixed first contact surface.

It is especially advantageous if the actuator means can expand and contract at least in one direction, preferably at least in the direction pointing to the fixed first contact surface with a frequency of at least 0.1 Hz so that here too the second contact surface moves back and forth in the expansion and contraction of the actuator means relative to the carrier body with the frequency of this expansion and contraction.

Another advantageous arrangement as claimed in the invention for producing a mechanical load on the bonding strip has:
 a carrier body,
 a first contact surface which is fixed relative to the carrier body for attachment by bonding one end of the bonding strip,
 a piezoelectric actuator means which is mounted on the carrier body and which can expand and contract at least in one direction relative to the carrier body, and
 a second contact surface mounted on the actuator means for attachment by bonding the other end of the bonding strip which moves back and forth in one direction relative to the carrier body when the actuator means expands and contracts, the second contact surface is held on a support body which is attached to the actuator means and which moves back and forth during expansion and contraction or the actuator means relative to the carrier body [sic]. In this arrangement moreover the features, especially all features of arrangements given above for producing a mechanical load on the bonding wire or strip can be implemented.

The support body preferably has one leg attached to the actuator means and one unsupported other leg on which the second contact surface is held.

The advantages of the arrangement as claimed in the invention include especially:

Simplified test execution compared to vibration machines due to the compact structure.

The displacement paths are adjustable to 1 micron in the piezoelectric actuators used. The maximum displacement path in these models is 50 microns.

By using piezoelectric actuators for lateral displacement of the bond base points, no hysteresis occurs in positioning, in contrast to electromechanical positioning elements (stepping motors). The vibration amplitude (wire deflection) is therefore unchanged even after millions of cycles.

The maximum vibration frequency is a few kHz. It is determined by the bandwidth of the piezoelectric actuators used and the resonant frequency of the arrangement, but with a suitable selection can be expanded to even higher frequencies. Stress tests can therefore be clearly accelerated.

Any time characteristic of deflection can be set (rectangular, ramp, sine functions) and thus complex loading cases can be studied.

The bond surfaces or contact surfaces are freely selectable (circuit board, DCB, bond pad on chip, etc.).

The geometry of the bond arc (width, height) and strip or wire material and strip or wire diameter can be freely selected.

A combination of the mechanical loading case with the loading of one performance cycle is possible. The bond arc can be stressed mechanically in the indicated arrangement and at the same time currents can be impressed or wire parameters such as the electrical resistance can be measured.

Any standard mounting techniques can be used as the second contact surface, for example copper-laminated circuit boards, DCB ceramics, chips with bond pads, etc. The lateral displacement of the bond base point attached to this contact surface can be adjusted via a high voltage which is applied to the piezoelectric actuator or the actuator means. In one test set-up at a maximum voltage of 1000 V displacement of 50 microns was achieved. The first contact surface is a surface, for example, a circuit board, which is located roughly 1 mm away from the movable surface and which is connected permanently to the carrier body for example in the form of a base plate. If the actuator or the actuator means is de-energized, it remains mechanically fixed on the carrier body. The bond base points cannot move therefore during and after production of the bond connection so that premature damage to the strip or wire can be excluded. The arrangement can be easily integrated into commercial bonders, for example, ultrasonic bonders, due to the compact structure.

Preferred applications of the invention are the power modules, integrated converters and chips on board.

The invention is detailed by way of example in the following description using the drawings.

FIG. 1 shows a side view of one embodiment of an arrangement as claimed in the invention with a piezoelectric actuator, FIG. 2 shows an overhead view of the embodiment as shown in FIG. 1, FIG. 3 shows a block diagram for electrical triggering of the actuator as shown in FIG. 1, and FIG. 4 shows a side view of a sample piezoelectric actuator means which can expand and contract independently in three directions perpendicular to one another and in the example shown in FIGS. 1 and 2 can be used in place of the actuator there.

The figures are schematic and not to scale.

In the example shown in FIGS. 1 and 2, the carrier body is labelled 1, the first contact surface which is fixed relative to the carrier body 1 is labelled 2, the piezoelectric actuator mounted on the carrier body 1 is labelled 3 and the second contact surface mounted on the actuator 3 is labelled 4. The actuator 3 can be imagined as a piezoelectric actuator means which has only one piezoelectric actuator.

The actuator 3 is mounted on the plane surface 10 of the carrier body 1 and expands and contracts parallel to the surface 10 in the direction of the double arrow 31.

The first and second contact surface 2 and 4 are each located facing away from the surface 10 of the carrier body 1 and essentially at the same vertical distance h from the surface 10 and have a distance d from one another in the direction of the double arrow 31. The distance d which is defined by an air gap 24 which runs transversely to the direction of the double arrow 31 between the contact surfaces 2 and 4 must be relatively large for safety reasons, typically 1 mm.

BRIEF DESCRIPTION OF THE DRAWINGS

The first contact surface 2 is attached for example to a base 12, for example a metal block, fixed on the surface 10 of the carrier body 1.

The second contact surface 4 is held on an unsupported support body 34 which is mounted on the actuator 3 and which moves back and forth when the actuator 3 expands and contracts relative to the carrier body 1 in the direction of the double arrow 31. For example, the support body 34 is an angle which consists of metal for example, which has two legs 341 and 342, and which is attached directly by the leg, for example the leg 341, for example, by screwing, to the actuator 3, and on its unsupported other leg 342 the second contact surface 4 is held.

Figure 1:
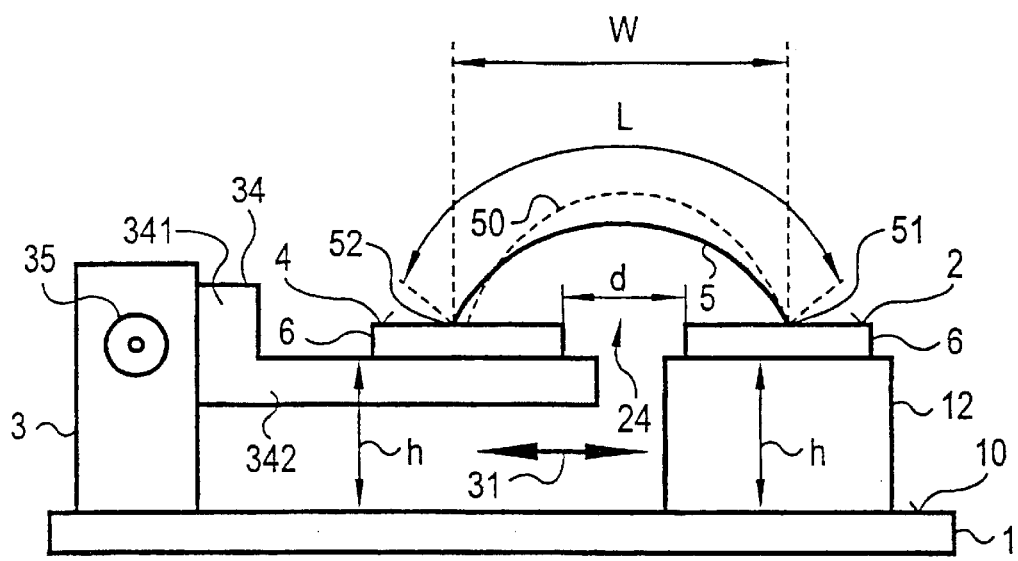

The actuator 3 when a high voltage is applied undergoes shearing which is shown highly exaggerated in FIG. 1 by the dotted line 30 and leads to the reciprocating motion of the support body 34 in the direction of the double arrow 31. The high voltage can be applied by a high voltage sleeve 35 which is attached to the actuator 3.

Figure 2:
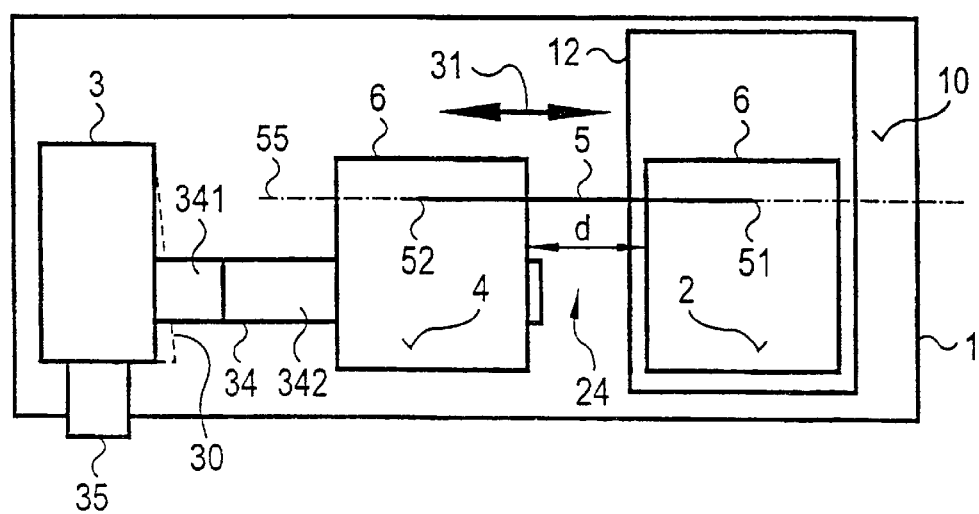

On the first contact surface 2 one end 51 of the bonding strip is attached by bonding, and on the second contact surface 4 the other end 52 of the bonding strip 5 is attached by bonding. The distance W between the two attached ends 51 and 52 is smaller than the length L of the bonding strip 5 between these ends 51 and 52 so that the bonding strip 5 attached in this way describes an arc which bridges the air gap 24. Preferably the bonding strip 5 is attached to the contact surfaces 2 and 4 such that a straight line which connects the two attached ends 51 and 52 to one another runs in the direction of the double arrow 31. In FIG. 2 one such straight line is given by the dot-dash line 55.

Instead of only one bonding strip, two or more such strips can be attached at the same time to the contact surfaces 2 and 4.

When the actuator 3 is activated so that it expands or contracts in the direction of the double arrow 31, the second contact surface 4 moves in this direction toward the fixed first contact surface 2 or away from it and thus increases or decreases the distance W. Accordingly the arc of the bonding strip 5 flattens or arches. In FIG. 2 the arc of the bonding strip 5 which is arched at the reduced distance W is shown highly exaggerated by the broken line 50. When the actuator 3 is operated such that it periodically expands and contracts, the distance W changes periodically.

So that the example as shown in FIGS. 1 and 2 makes it possible to simulate the mechanical loading case of displacement of the base points of the bond connection under vibration or shock stress for bonding strips 5 in the form of bonding wires, especially thick wires, the actuator 3 can expand and contract with a frequency of at least 0.1 Hz to a few kilohertz.

One specific implementation of the embodiment was used for mechanical fatigue of bonding wires. In this implementation three wires with a different aspect ratio L/W were attached to the contact surfaces 2 and 4 by bonding. The contact surfaces 2 and 4 were defined by plates 6 of copper-laminated circuit boards (FR4) which were attached to the base 12 or the unsupported leg 342 of the support body 34.

Figure 3:
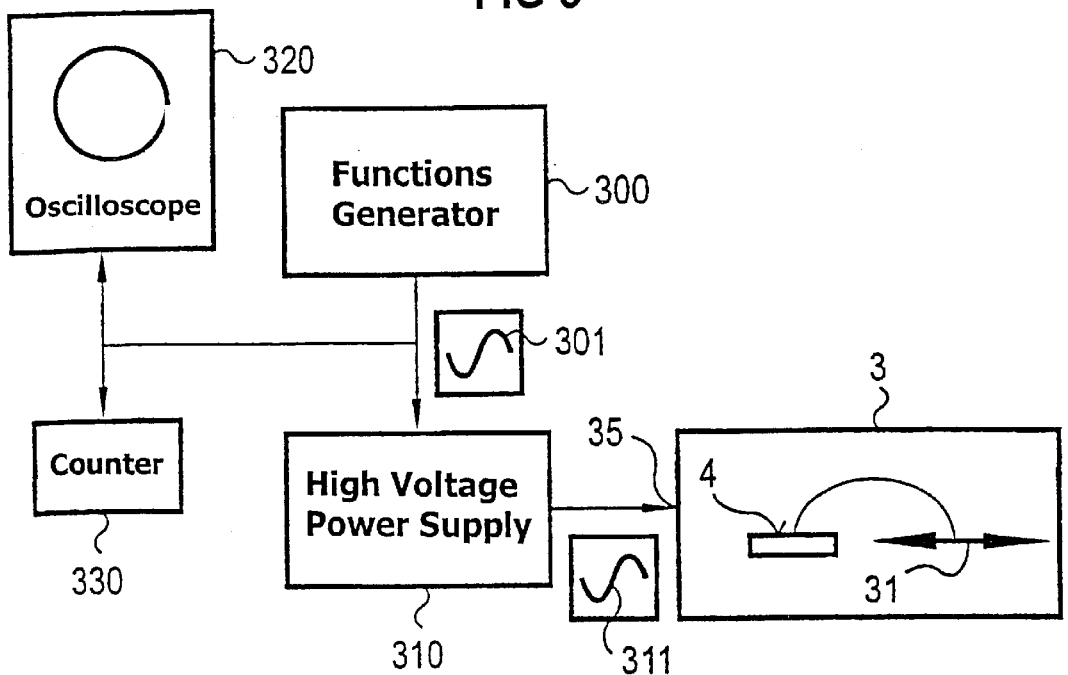

The circuit shown in FIG. 3 is suited for steady loading tests for electrical triggering of the actuator 3 of the example as shown in FIGS. 1 and 2. For the case of vibration loading a function generator 300 is used to produce a sinusoidal oscillation 301. The sinusoidal oscillation 301 is routed to a high voltage power supply source 310 which produces the corresponding control voltage 311 for the actuator 3. This control voltage 311 is supplied via the high voltage sleeve 35 to the actuator 3.

To check the amplitude and the frequency of the control voltage 311 an oscilloscope 320 can be used. The number of loading cycles is measured with an electronic counter 330. In the case of a combination of the mechanical loading test with a performance cycle the wire 5 is electrically heated with a constant current source which is periodically turned on and off. This source is not indicated in FIG. 3, since it is equipment specific to the performance cycle.

Figure 4:
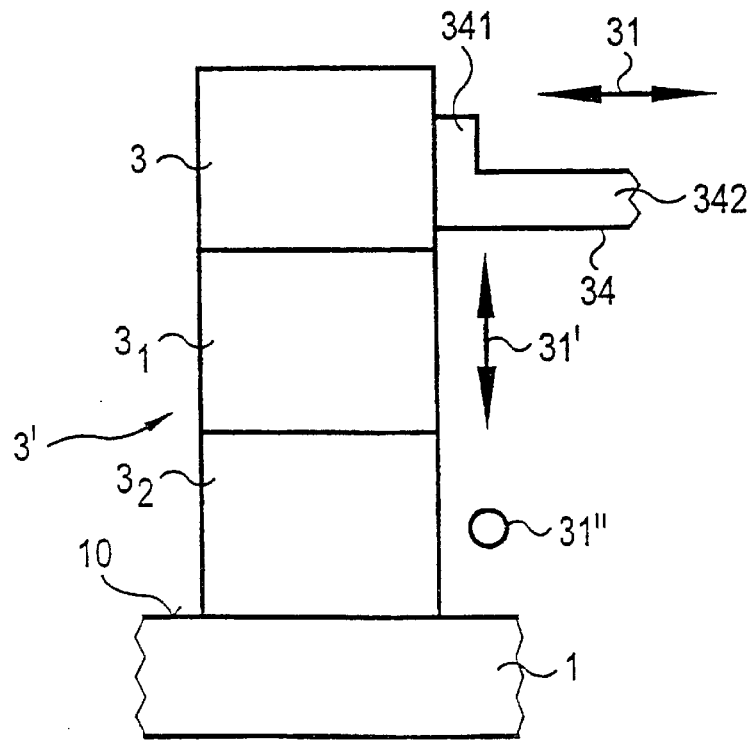

The sample piezoelectric actuator means 3' shown in FIG. 4 in a side view can expand and contract independently in for example three directions 31, 31' and 31" which are perpendicular to one another and in the example as shown in FIGS. 1 and 2 are used instead of the actuator 3 there.

The actuator means 3' is mounted on the carrier body 1 and can expand and contract relative to the carrier body 1 independently in the horizontal direction of the double arrow 31 which points to the first contact surface 2 in the direction of the double arrow 31' which is vertical to this direction and in the direction 31" which is perpendicular to these two directions. The direction 31" is perpendicular to the plane of the drawing of FIG. 4.

The second contact surface 4 which is not shown in FIG. 4 is attached to the actuator means 3' such that it moves back and forth in each of the three directions 31, 31' and 31" relative to the carrier body 1 when the actuator means 3' expands and contracts.

For example, the actuator means 3' has a sequence of three interconnected actuators $3_2$, $3_1$ and 3, the actuator $3_2$ which forms the first actuator of the sequence being mounted on the carrier body 1 and expanding and contracting for example in the direction 31" relative to the carrier body 1.

The actuator $3_1$ following the first actuator $3_2$ is connected to the first actuator $3_2$ such that when the first actuator $3_2$ expands and contracts in direction 31" the actuator $3_1$ moves back and forth in this direction 31" relative to the carrier body 1.

The actuator $3_1$ can expand and contract independently in the direction 31' relative to the carrier body 1.

The actuator 3 following the actuator $3_1$ is connected to the actuator $3_1$ such that when the actuator $3_1$ expands and contracts in the direction 31' the actuator 3 moves back and forth in this direction 31' relative to the carrier body 1.

If both the actuator $3_2$ and also the actuator $3_1$ expand and contract, the actuator 3 moves back and forth in the direction 31" and also in the direction 31' perpendicular to this direction 31" relative to the carrier body 1.

If either only the actuator $3_2$ or the actuator $3_1$ expands, the actuator 3 moves back and forth only in direction 31" or in direction 31' relative to the carrier body 1.

The actuator 3 itself can expand and contract independently in the direction 31 relative to the carrier body 1.

The second contact surface 4 which is not shown is for example held on a support body 34 which is attached to the actuator means 3' and which moves back and forth upon expansion and contraction or the actuator means 3' relative to the carrier body 1 [sic].

In particular, the support body 34 is mounted on the actuator such that the support body 34 moves back and forth in this direction 31 when the actuator 3 expands and contracts in direction 31. In addition, the support body 34 executes any other reciprocating motion of the actuator 3 relative to the carrier body 1. The corresponding applies to the second contact surface 4 which is held on the support body 34, i.e. this contact surface 4 moves in the direction 31 and/or in the direction 31' and/or in the direction 31".

For example, the support body 34 has a leg 341 attached to the actuator 3 of the actuator means 3' and an unsupported other leg 342 on which the second contact surface 4 is held.

Feasibly, at least the actuator 3 can expand and contract in the direction 31, over also the actuator 31 in the direction 31' and/or the actuator $3_2$ in the direction 31" with a frequency of at least 0.1 Hz.

FIG. 3
320 oscilloscope
330 counter
300 function generator
310 high voltage power supply part

What is claimed is:

1. Arrangement for producing a mechanical load on a bonding wire (5), which comprises:
   a carrier body (1),
   a first contact surface (2) which is fixed relative to the carrier body (1) for attachment by bonding one end (51) of the bonding wire (5),
   a piezoelectric actuator (3) which is mounted on a carrier body (1) and which can expand and contract relative to the carrier body (1) and in the direction (31) to the first contact surface (2) with a frequency of at least 0.1 Hz,
   a second contact surface (4) attached to the actuator (3) for attachment by bonding the other end (52) of the bonding wire (5) which moves back and forth upon expansion and contraction of the actuator (3) relative to the carrier body (1) and in the direction (31) to the first contact surface (2) with the frequency of this expansion and contraction.

2. Arrangement for producing a mechanical load on a bonding strip (5), which comprises:

a carrier body (1), a first contact surface (2) which is fixed relative to the carrier body (1) for attachment by bonding one end (51) of the bonding strip (5), a piezoelectric actuator means (3, 3') which is mounted on a carrier body (1) and which can expand and contract relative to the carrier body (1) at least one direction (31; 31", 31', 31) and a second contact surface (4) attached to the actuator means (3, 3') for attachment by bonding the other end (52) of the bonding strip (5) which moves back and forth relative to the carrier body (1) in one direction (31; 31", 31', 31) when the actuator means (3, 3') expands and contracts, the second contact surface (4) being held on a support body (34) which is attached to the actuator means (3, 3') and which moves back and forth during expansion and contraction of the actuator means (3, 3') relative to the carrier body (1).

3. Arrangement as claimed in claim 2, the support body (34) having one leg (341) attached to the actuator means (3, 3') and one unsupported other leg (342) on which the second contact surface (4) is held.

4. Arrangement for producing a mechanical load on a bonding strip (5), which comprises:

a carrier body (1), a first contact surface (2) which is fixed relative to the carrier body (1) for attachment by bonding one end (51) of the bonding strip (5), a piezoelectric actuator means (3') which is mounted on a carrier body (1) and which can expand and contract relative to the carrier body (1) independently in at least two different directions (31, 31', 31"), and a second contact surface (4) attached to the actuator means (3') for attachment by bonding the other end (52) of the bonding strip (5) which moves back and forth relative to the carrier body (1) in each direction (31, 31', 31") in which the actuator means (3') expands and contracts.

5. Arrangement as claimed in claim 4, the actuator means (3') having a sequence of two or more interconnected actuators ($3_2$, $3_1$, 3), and each actuator ($3_2$, $3_1$, 3) can expand and contract in each of one direction (31", 31', 31) assigned only to it, the first actuator ($3_2$) of the sequence is mounted on the carrier body (1) and expands and contracts in the direction (31") assigned to it relative to the carrier body (1), each actuator ($3_2$, $3_1$) connected to the next actuator ($3_1$, 3), when it expands and contracts in the direction (31", 31') assigned to it, moving this next actuator ($3_1$, 3) back and forth in this direction (31", 31') relative to the carrier body (1), and the second contact surface (4) being mounted on the last actuator (3) of the sequence, and moving back and forth in this direction (3) relative to the carrier body (1) when the last actuator (3) expands and contracts in the direction (31) assigned to it.

6. Arrangement as claimed in claim 5, one (31) of the different directions (31", 31', 31) pointing to the fixed first contact surface (2).

7. Arrangement as claimed in claim 4, one (31) of the different directions (31", 31', 31) pointing to the fixed first contact surface (2).

8. Arrangement as claimed in claim 7, and the actuator means (3') can expand and contract at least in one direction (31) with a frequency of at least 0.1 Hz.

* * * * *